United States Patent
Gilley et al.

[11] Patent Number: 5,650,904
[45] Date of Patent: Jul. 22, 1997

[54] FAULT TOLERANT THERMOELECTRIC DEVICE CIRCUIT

[75] Inventors: Michael D. Gilley, Rowlett; Michael J. Doke, Dallas, both of Tex.

[73] Assignee: Marlow Industries, Inc., Dallas, Tex.

[21] Appl. No.: 618,403

[22] Filed: Mar. 19, 1996

Related U.S. Application Data

[63] Continuation of Ser. No. 194,101, Feb. 8, 1994, abandoned.
[51] Int. Cl.⁶ .................................................. H02H 9/00
[52] U.S. Cl. ........................... 361/56; 361/5.8; 62/3.7
[58] Field of Search ..................... 361/56, 58, 54; 62/3.7

[56] References Cited

U.S. PATENT DOCUMENTS

| | | | |
|---|---|---|---|
| 3,048,020 | 8/1962 | Jones . | |
| 3,077,079 | 2/1963 | Pietsch | 62/3 |
| 3,573,550 | 4/1971 | Baker, Jr. . | |
| 3,601,632 | 8/1971 | Frazier | 307/219 |
| 3,823,567 | 7/1974 | Corini | 62/3 |
| 4,326,383 | 4/1982 | Reed et al. | 62/3 |
| 4,472,945 | 9/1984 | Cech et al. | 62/3 |
| 4,726,193 | 2/1988 | Burke et al. | 62/3 |
| 4,727,449 | 2/1988 | Fleck | 361/54 |
| 4,744,220 | 5/1988 | Kerner et al. | 62/3 |
| 4,833,888 | 5/1989 | Kerner et al. | 62/3 |
| 4,934,150 | 6/1990 | Fessler . | |
| 5,209,069 | 5/1993 | Neuman | 62/3.64 |
| 5,367,890 | 11/1994 | Doke | 62/3.7 |

FOREIGN PATENT DOCUMENTS

| | | |
|---|---|---|
| 1125957 | 3/1962 | Germany . |
| 1198837 | 6/1964 | Germany . |
| 320580A | 1/1991 | Japan . |
| 8101739 | 6/1981 | WIPO . |
| 8504948 | 11/1985 | WIPO . |

*Primary Examiner*—Todd E. DeBoer
*Attorney, Agent, or Firm*—Baker & Botts, L.L.P.

[57] ABSTRACT

Fault tolerant thermoelectric device circuit (18) is provided including a plurality of thermoelectric elements (19, 20, 21, and 22) and a plurality of secondary by-pass circuits (24, 25, 26, and 27) coupled in parallel with a number of the thermoelectric elements. The secondary by-pass circuits provide by-pass paths to failed thermoelectric elements, thereby allowing the remaining elements to continue operating. Primary by-pass circuit (30) is also provided to provide a by-pass path to all of the thermoelectric elements as required.

20 Claims, 2 Drawing Sheets

FAULT TOLERANT THERMOELECTRIC DEVICE CIRCUIT

This application is a continuation of application Ser. No. 08/194,101, filed Feb. 8, 1994, entitled "Fault Tolerant Thermoelectric Device Circuit" by Michael D. Gilley, et al., now abandoned.

TECHNICAL FIELD OF THE INVENTION

This invention relates in general to the field of thermoelectric devices, and more particularly to a fault tolerant thermoelectric device circuit.

BACKGROUND OF THE INVENTION

The basic theory and operation of thermoelectric devices has been developed for many years. Thermoelectric devices can function as either a cooler or a heater. Thermoelectric devices are essentially small heat pumps which follow the laws of thermodynamics in the same way as mechanical heat pumps, refrigerators, or any other apparatus used to transfer heat energy. The principal difference is that thermoelectric devices function with solid state electrical components as compared to more traditional mechanical/fluid heating and cooling components.

A circuit for a simple thermoelectric device generally includes two dissimilar materials such as N-type and P-type thermoelectric semiconductor elements. The thermoelectric elements are typically arranged in an alternating N-element and P-element configuration, and the thermoelectric elements are coupled electrically in series and thermally in parallel. The Peltier effect occurs when voltage is applied to the N-type and P-type elements resulting in current flow through the serial electrical connection and heat transfer across the N-type and P-type elements in the parallel thermal connection. In a typical thermoelectric element array, the direction of heat transfer is indicated by the direction of net current flow through the thermoelectric elements.

A disadvantage of currently available thermoelectric device circuits is their lack of fault tolerance. Because the thermoelectric elements are electrically connected in series, the failure of a single element generally causes an open circuit condition in the device. The open circuit prevents any of the elements in the thermoelectric device from receiving the current required to provide cooling or heating. Since a single failed element within currently available thermoelectric device circuits can cause the entire thermoelectric device to fail, presently available thermoelectric device circuits are said to lack fault tolerance.

Currently available thermoelectric device circuits also have the disadvantage of lacking fault notification. Cooling and heating stop when currently available thermoelectric device circuits fail, but no failure indication is provided. If the thermoelectric device circuit is not checked periodically, the load to which the thermoelectric device circuit is applied may be damaged.

Presently available thermoelectric device circuits are difficult, if not impossible, to troubleshoot and repair because they lack fault isolation. Thermoelectric device circuits may contain multiple thermoelectric elements and devices. It is a difficult task to identify a failed or intermittent element within a long series of elements without a fault isolation mechanism in the circuit.

Previously developed thermoelectric device circuits have low mean-time-between-failure (MTBF) ratings because the serial coupling of thermoelectric elements does not provide fault tolerance. Presently available thermoelectric device circuits may be, therefore, undesirable to use because they do not provide fault tolerance, fault notification, or fault isolation.

SUMMARY OF THE INVENTION

In accordance with the present invention, a thermoelectric device circuit is provided that substantially eliminates or reduces disadvantages and problems associated with previously developed thermoelectric device circuits. The present invention provides a thermoelectric device circuit with fault tolerance, fault notification, and fault isolation.

A fault tolerant circuit is provided for use with thermoelectric devices. The circuit may include a thermoelectric element for transferring heat and an electrical circuit for supplying electricity to the thermoelectric element. The circuit may also include a by-pass circuit coupled in parallel with the thermoelectric element that provides a by-pass path around the thermoelectric element should the thermoelectric element fail.

One aspect of the present thermoelectric device circuit includes multiple thermoelectric elements for transferring heat. Coupled to each of the thermoelectric elements or to a number of thermoelectric elements is a by-pass circuit. The by-pass circuit provides a by-pass path for the thermoelectric element or elements should the thermoelectric element or elements fail. The by-pass circuit can also provide a fault signal to indicate the failure of its associated thermoelectric element or elements.

Another aspect of the present invention provides a thermoelectric device system including a plurality of serially connected thermoelectric devices for providing heat transfer when electricity is supplied to the thermoelectric devices. Each thermoelectric device includes at least one thermoelectric element for transferring heat. The thermoelectric system also includes a plurality of by-pass circuits coupled in parallel with one of the thermoelectric devices. Each by-pass circuit can detect a failure in its associated thermoelectric device and provide a by-pass path around the failed device.

The present thermoelectric device circuit provides the technical advantages available with previously developed thermoelectric device circuits over other heating/cooling techniques and apparatus, e.g., small size, low power, and simple design. The present thermoelectric device circuit is compatible with all present applications for thermoelectric devices.

The thermoelectric device circuit of the present invention provides technical advantages of fault tolerance, fault notification, and fault isolation. The present thermoelectric device circuit provides increased reliability and higher MTBF ratings over currently available thermoelectric device circuits due to its fault tolerance capability. This in turn, provides a technical advantage of lower maintenance costs for the thermoelectric device circuit of the present invention.

The present thermoelectric device circuit provides a technical advantage of being effective in heating, cooling, and power generating applications. Also, the present circuit provides a technical advantage of using readily available components. Therefore, the thermoelectric device circuit of the present invention has relative low cost over more traditional mechanical/fluid heating and cooling component systems.

BRIEF DESCRIPTION OF THE DRAWINGS

For a more complete understanding of the present invention and the advantages thereof, reference is now made to the following written description taken in conjunction with the accompanying drawings in which like reference numbers indicate like features, and wherein.

DETAILED DESCRIPTION OF THE INVENTION

The preferred embodiments of the present invention and its advantages are best understood by referring to FIGS. 2 through 5 of the drawings, like numerals being used for like and corresponding parts of the various drawings.

Figure 1:
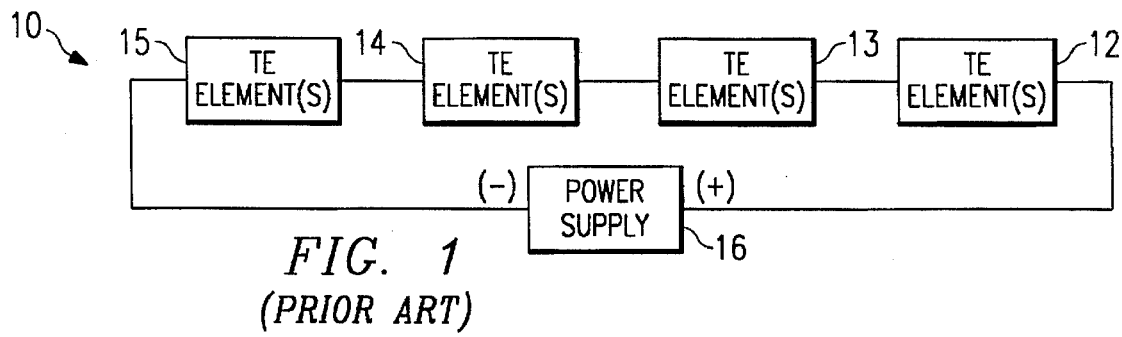
FIG. 1 shows a circuit schematic for a prior art thermoelectric device circuit.

FIG. 1 shows a schematic of prior art thermoelectric device circuit 10. Circuit 10 depicts two embodiments of prior art thermoelectric device circuits. In the first embodiment, circuit 10 includes four thermoelectric (TE) elements 12, 13, 14, and 15. Circuit 10 has the four thermoelectric elements coupled in series as is required for proper operation of circuit 10. Circuit 10 also includes power supply 16 that provides DC electricity to the thermoelectric elements.

A disadvantage of thermoelectric device circuit 10 of FIG. 1 is that because the thermoelectric elements are coupled in series, should any one of the thermoelectric elements fail, then the entire circuit 10 fails. Circuit 10 lacks fault tolerance because the failure of any single element causes the entire circuit to fail. For example, if thermoelectric element 12 fails, it will generally create an open-circuit condition preventing thermoelectric elements 13, 14, and 15 from receiving any DC current. Circuit 10, therefore, cannot perform cooling or heating as intended.

In an alternate embodiment of circuit 10 of FIG. 1, each block 12, 13, 14, and 15 represents a plurality of thermoelectric elements coupled in series within each block. Each block of thermoelectric elements 12, 13, 14, and 15, is then coupled serially with each other. In this embodiment, hundreds of thermoelectric elements can be coupled to form circuit 10. This embodiment of circuit 10 faces the same limitations and disadvantages as when each block 12, 13, 14, and 15 represents a single thermoelectric element. This alternate embodiment of circuit 10 also lacks fault tolerance. The failure of a single thermoelectric element within circuit 10 causes circuit 10 to be nonfunctional regardless of whether the failed element is located in block 12, 13, 14, or 15. Both embodiments of circuit 10, therefore, do not provide fault tolerance, fault isolation or fault notification.

Figure 2:
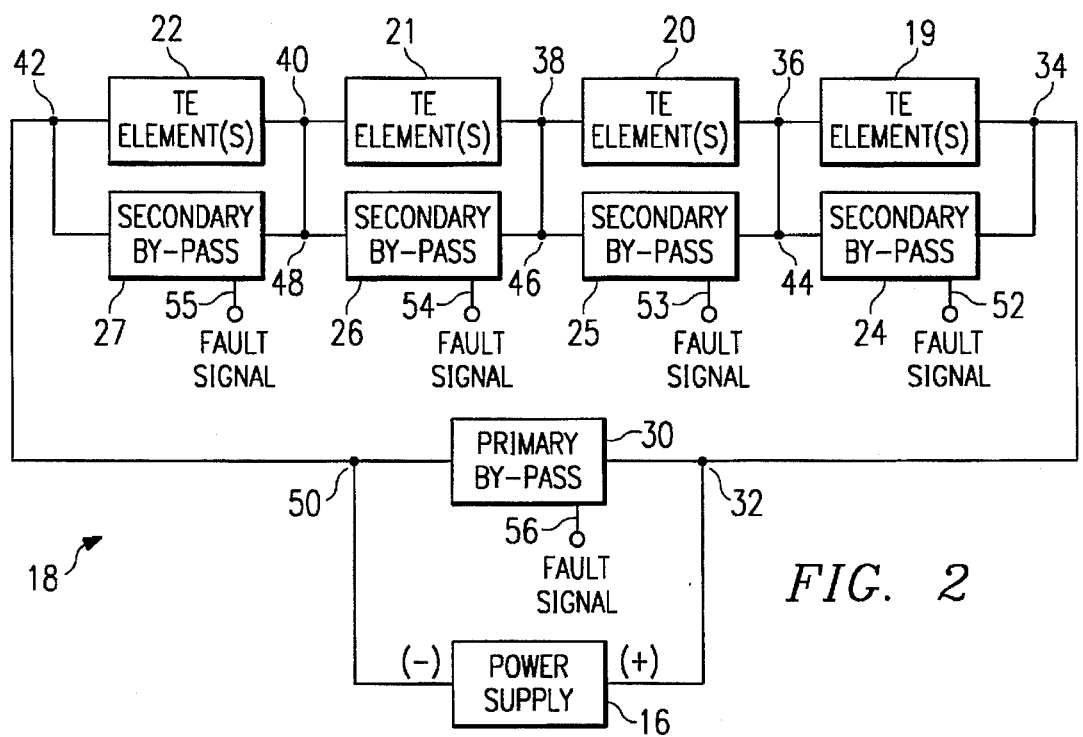
FIG. 2 is a circuit schematic depicting several embodiments of the present thermoelectric device circuit.

FIG. 2 is a circuit schematic depicting numerous embodiments of the fault tolerant circuit of the present invention. In one embodiment of circuit 18, each of the blocks identified as thermoelectric (TE) element(s) 19, 20, 21, and 22 represents a single thermoelectric element. Thermoelectric element(s) 19, 20, 21, and 22 are coupled in series. In an alternative embodiment of circuit 18, each block identified as thermoelectric element(s) represents a plurality of thermoelectric elements, where the thermoelectric elements within each block are serially coupled. Therefore, under the two embodiments, thermoelectric element(s) 19, for example, may be a single thermoelectric element or multiple thermoelectric elements. The number of thermoelectric element(s) blocks 19, 20, 21, and 22 represent does not change the inventive concepts of the present invention. Hereinafter, the term "thermoelectric element" will be used to denote both a single thermoelectric element or a plurality of thermoelectric elements represented by thermoelectric element(s) blocks 19, 20, 21, and 22.

Associated with each thermoelectric element of FIG. 2 is a secondary by-pass circuit coupled in parallel with the thermoelectric element. For example, secondary by-pass circuit 24 is coupled in parallel with thermoelectric element 19; secondary by-pass circuit 25 is coupled in parallel with thermoelectric element 20; secondary by-pass circuit 26 is coupled in parallel with thermoelectric element 21; and secondary by-pass circuit 27 is coupled in parallel with thermoelectric element 22. The secondary by-pass circuits are, in turn, serially coupled.

Also shown in circuit 18 is primary by-pass circuit 30. Primary by-pass circuit 30 is coupled in parallel with the groupings of thermoelectric elements and by-pass circuits. Primary by-pass circuit 30 is coupled across power supply 16.

During operation of circuit 18 of FIG. 2, power supply 16 provides DC current and voltage to thermoelectric elements 19, 20, 21, and 22. Each of the by-pass circuits, whether primary or secondary, presents a high impedance path in its normally off-state to the DC current supplied by power supply 16. Therefore, the current power supply 16 presents to node 32, between power supply 16 and thermoelectric element 19, does not normally enter primary by-pass circuit 30 due to the high impedance path presented by circuit 30. Likewise, the DC current presented by power supply 16 to node 34 does not normally enter secondary by-pass circuit 24. The DC current is supplied to thermoelectric element 19 where the Peltier effect as previously described causes cooling or heating.

Since thermoelectric elements 19, 20, 21, and 22 are coupled in series, the current through the elements is generally constant. The operation of the other groups of thermoelectric elements and secondary by-pass circuits of circuit 18 are as described for thermoelectric element 19 and secondary by-pass circuit 24. Therefore, in normal operation the thermoelectric elements use the current from power supply 16 for cooling and/or heating.

Should any of the thermoelectric elements of circuit 18 fail, then the failed element generally causes an open circuit blocking current flow to the other elements. For example, if thermoelectric element 19 fails it presents an open circuit at node 34. Secondary by-pass circuit 24, while a high impedance path, provides a lower impedance path at node 34 than the open circuit of failed element 19. Current is therefore conducted through secondary by-pass circuit 24 to the other elements. Secondary by-pass circuit 24 turns on and provides the DC current from node 34 to node 44. Secondary by-pass circuit 25 presents a high impedance path to the DC current at node 44. The DC current will then travel from node 44 to node 36 and into thermoelectric element 20. In this manner, the failure of thermoelectric element 19 is detected and by-passed in secondary by-pass circuit 24 so that the remaining thermoelectric elements in circuit 18 continue operating.

In a similar manner, should thermoelectric element 20 fail, then secondary by-pass circuit 25 provides current from node 44 to node 46. Additionally, secondary by-pass circuit 26 can provide DC current from node 46 to node 48 should thermoelectric element 21 fail, and secondary by-pass circuit 27 can provide current from node 48 to node 42 should thermoelectric element 22 fail.

While the operation of the secondary by-pass circuits of circuit 18 have been described in conjunction with a serial failure of thermoelectric elements 19, 20, 21, and 22, the operation of circuit 18 is not dependent on the thermoelectric elements failing serially. One technical advantage of circuit 18 is that each secondary by-pass circuit acts independently of the other devices of circuit 18. Therefore, for example, if thermoelectric elements 19, 20, and 21 are operating properly and thermoelectric element 22 fails, secondary by-pass circuit 27 provides a by-pass path from node 48 to node 42 so that circuit 18 continues functioning. It is noted that while node pairs 36 and 44, 38 and 46, and 40 and 48, are depicted and described separately, that they may be combined into a single node without departing from the inventive concepts of the present invention.

Additionally, circuit 18 of FIG. 2 includes primary by-pass circuit 30. Primary by-pass circuit 30 provides a by-pass path for the DC current provided by power supply 16 so that when too many of the thermoelectric elements of circuit 18 fail, the remaining DC current is not supplied to the remaining operating thermoelectric elements. This prevents the remaining thermoelectric elements from being damaged by a high current load. When a predetermined number of thermoelectric elements in circuit 18 fail, primary by-pass circuit 30 presents a direct path between node 32 and node 50 so that all of the thermoelectric elements are by-passed.

With the described technique, circuit 18 provides fault tolerance should an individual thermoelectric element fail. Circuit 18 can be designed so that circuit 18 continues operating despite the failure of a number of thermoelectric elements. Once the predetermined number of thermoelectric element failures exceeds the predetermined number, then the primary by-pass circuit 30 causes the remaining thermoelectric elements in circuit 18 to be by-passed. In this way, circuit 18 has increased fault tolerance as compared to the prior art, where the failure of a single thermoelectric element causes the entire circuit to be non-operational.

The by-pass circuits of circuit 18 of FIG. 2 can also include the capability to provide a fault signal when providing a by-pass path. In this manner, for example, secondary by-pass circuit 24 includes fault signal terminal 52, secondary by-pass circuit 25 includes fault signal terminal 53, secondary by-pass circuit 26 includes fault signal terminal 54, secondary by-pass circuit 27 includes fault signal terminal 55, and primary by-pass circuit 30 includes fault signal terminal 56. Coupling the fault signal terminals to an indicating device, as is well known in the art, provides fault notification and fault isolation for circuit 18. In this manner, should thermoelectric element 21 fail causing the activation of secondary by-pass circuit 26, secondary by-pass circuit 26 generates a fault signal at fault signal terminal 54. Providing the fault signal to an appropriate indicator device, such as a light emitting diode (LED), allows the failure of thermoelectric element 21 to be more efficiently detected and allows for easier trouble-shooting of circuit 18. Providing fault signals from the by-pass circuits of circuit 18 gives circuit 18 the technical advantages of having fault isolation and fault notification.

Including the by-pass circuits in circuit 18 of FIG. 2 makes circuit 18 a fault tolerant circuit. This, in turn, gives circuit 18 a higher MTBF rating because the failure of a single thermoelectric element does not result in the failure of circuit 18. A higher MTBF rating and fault isolation provide a technical advantage of lower maintenance costs during troubleshooting and repair of circuit 18 of FIG. 2.

Figure 3A:
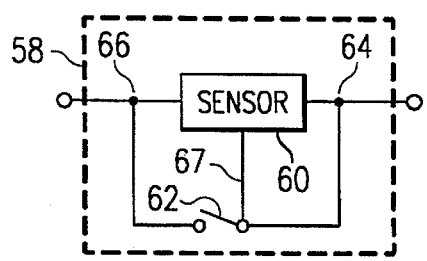
FIGS. 3a through 3d are circuit schematics depicting several embodiments of the by-pass circuit of the present thermoelectric device circuit.

FIGS. 3a through 3d show schematics of several possible embodiments of the by-pass circuits of FIG. 2. FIG. 3a shows by-pass circuit 58 including sensor 60 and switch 62. Sensor 60 is coupled in parallel with switch 62 between nodes 64 and 66. Sensor 60 provides a control signal 67 to switch 62. Circuit 58 has a high input impedance at node 64. By-pass circuit 58 is coupled in parallel with a thermoelectric element as shown in FIG. 2.

When its associated thermoelectric element fails, current is conducted into by-pass circuit 58. This in turn causes the voltage across sensor 60 to increase. Once the voltage across nodes 64 and 66 reaches a predetermined level, sensor 60 provides control signal 67 causing switch 62 to close. Closing switch 62 allows current to flow from node 64 through switch 62 and to node 66, thereby providing a by-pass path through circuit 58.

Figure 3B:
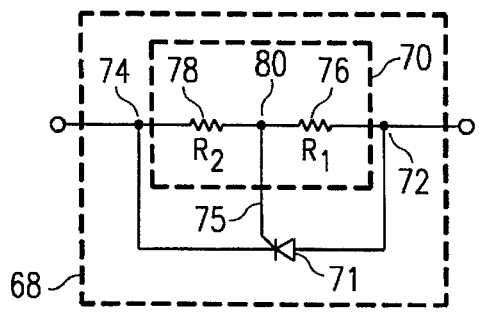

FIG. 3b is a schematic diagram of another embodiment of the by-pass circuits of FIG. 2 including voltage divider circuit 70 and switch or silicon controlled rectifier (SCR) 71. By-pass circuit 68 includes input node 72 and output node 74 with voltage divider circuit 70 coupled in parallel with SCR 71 between nodes 72 and 74. Voltage divider circuit 70 provides control signal 75 to the gate of SCR 71. Voltage divider circuit 70 includes R1 76 and R2 78. Resistors 76 and 78 are chosen to control the voltage at node 80 which is the voltage of control signal 75.

In operation of by-pass circuit 68 of FIG. 3b, the failure of its associated thermoelectric element causes current flow into node 72 and into voltage divider circuit 70. As the current flows into voltage divider circuit 70, the voltage at node 80 increases to the point at which it reaches the turn-on voltage for SCR 71. Once the turn-on voltage for SCR 71 is reached at node 80, SCR 71 turns on and presents a low impedance path to the current flowing between nodes 72 and 74, thereby providing a by-pass path through circuit 68. SCR 71 is selected with a turn-on voltage consistent with the operating voltages of the thermoelectric elements to which by-pass circuit 68 is coupled.

Figure 3C:
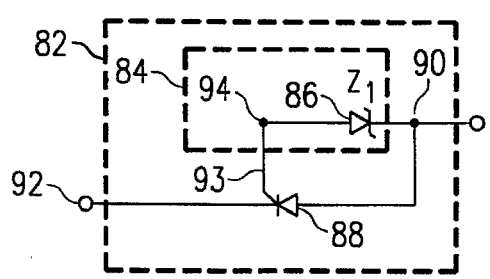

FIG. 3c shows a schematic diagram for another embodiment of the by-pass circuits of circuit 18 of FIG. 2. By-pass circuit 82 includes voltage divider circuit 84 and SCR 88. Voltage divider circuit 84 includes zener diode 86. Zener diode 86 and SCR 88 are coupled in parallel between nodes 90 and 92. Zener diode 86 provides control signal 93 to the gate of SCR 88.

In operation of circuit 82, zener diode 86 presents a high impedance path to current at node 90. A failure of the thermoelectric element to which by-pass circuit 82 is coupled causes current to flow into node 90 and into zener diode 86. As the voltage across nodes 90 and 94 increases, zener diode 86 eventually turns on, providing a voltage at node 94 representing control signal 93. Zener diode 86 is selected so that the voltage at node 94 is sufficient to turn-on SCR 88. Once SCR 88 is turned on, current flows through SCR 88 between nodes 90 and 92, thereby presenting a by-pass path within circuit 82.

Figure 3D:
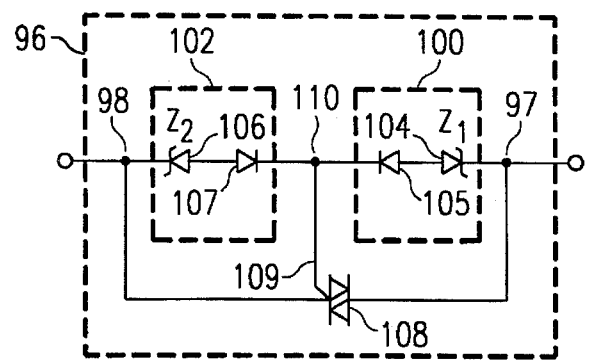

FIG. 3d shows a schematic diagram for another embodiment of the by-pass circuits of circuit 18 of FIG. 2. By-pass circuit 96 of FIG. 3b is an embodiment that can be used where the thermoelectric element to which by-pass circuit 96 is coupled is used for both heating and cooling.

Therefore, by-pass circuit 96 can supply current in both directions between nodes 97 and 98. By-pass circuit 96 includes first voltage divider circuit 100 and second voltage divider circuit 102. Voltage divider circuit 100 includes zener diode 104 and diode 105. Voltage divider circuit 102 includes zener diode 106 and diode 107. Also included in by-pass circuit 96 is triac 108. Voltage divider circuits 100 and 102 provide at node 110 control signal 109 to the gate of triac 109. It is noted that voltage divider circuits 100 and 102 of FIG. 3d can be replaced with voltage divider circuit 70 of FIG. 3b without departing from the inventive concepts of the present invention.

When the thermoelectric element to which by-pass circuit 96 is coupled is in cooling mode and experiences a failure, current enters node 97. The current at node 97 causes zener diode 104 to turn on. Zener diode 104 provides control signal voltage 109 at node 110. Diode 107 in voltage divider circuit 102 prevents any voltage leakage through zener diode 106 when current is conducted from node 97 to node 98. Zener diode 104 is selected so that the voltage at node 110 is sufficient to turn on triac 108, thereby providing a by-pass path through by-pass circuitry 96 from node 97, through triac 108, and to node 98.

Alternatively, when by-pass circuit 96 is coupled to a thermoelectric element in heating mode and the thermoelectric element fails, current flows into node 98. Current into node 98 causes zener diode 106 to turn on and provide control signal voltage 109 at node 110. The voltage presented at node 110 by zener diode 106 is sufficient to turn on triac 108 so that current flows from node 98 to node 97 through triac 108 providing a by-pass path through circuit 96. Diode 105 in voltage divider circuit 100 prevents any voltage leakage through zener diode 104 when current is conducted from node 98 to node 97. By-pass circuit 96 provides a technical advantages of fault tolerance in circuits like circuit 18 of FIG. 2 that are used for both cooling and heating.

The by-pass circuits described in connection with FIGS. 3a–3d may be used for either the primary or secondary by-pass circuits of FIG. 2. It is noted that the by-pass circuits of FIG. 2 are not limited to those embodiments depicted in FIGS. 3a through 3d. FIGS. 3a through 3d provide examples of by-pass circuits of circuit 18. It is also noted that the by-pass circuits of circuit 18 may have different embodiments within circuit 18.

The by-pass circuits of FIGS. 2 and 3a–d may be designed with their impedance as a controlled parameter. For example, if circuit 18 was designed such that each of the thermoelectric elements 19, 20, 21, and 22 provides 2 Ω of impedance to the network, then each of the secondary by-pass circuits can be designed so that they provide an equivalent 2 Ω impedance. This ensures that the current load in the circuit does not change upon the failure of a thermoelectric element and the activation of a by-pass circuit. This provides a technical advantage of preventing any of the elements of circuit 18 from being over-stressed from an increased current load.

Alternatively, a by-pass circuit can be designed to have a non-matching impedance to their respective thermoelectric element. For example, if thermoelectric element 19 has an impedance of 2 Ω, secondary by-pass circuit 24 can be designed to have an impedance of only 1 Ω. Then, when thermoelectric element 19 fails, and secondary by-pass circuit 24 activates, it would allow the DC current in circuit 18 to increase. This allows the other elements within circuit 18 to receive the increased current and compensate for the loss of the cooling or heating capability of thermoelectric element 19. This is not without limitation, however, as the efficiency of the thermoelectric element is limited by the amount of current supplied to it. If the current supplied to a thermoelectric element is too high, then the thermoelectric element is not an effective cooler or heater. Also, the materials of the thermoelectric element and its intercouplings may have current limitations above which they are damaged.

Figure 4:
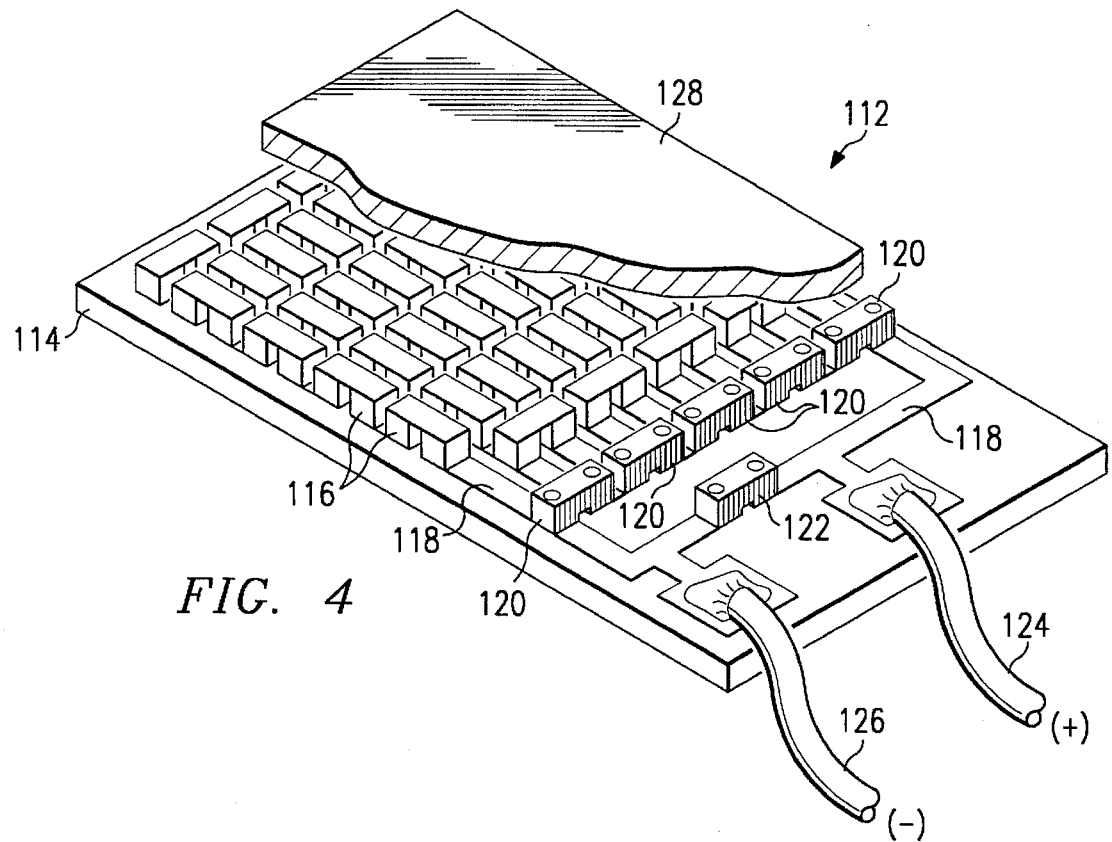
FIG. 4 is an enlarged isometric drawing, in sections and in elevation with portions broken away, of the present thermoelectric device circuit.

FIG. 4 shows a thermoelectric device circuit 112 including a plurality of thermoelectric elements and by-pass circuits. Thermoelectric device circuit 112 includes thermally conductive plate 114 with a plurality of thermoelectric elements 116 mounted on electrically conductive strip 118. Note that thermoelectric elements 116 are electrically coupled in series. Also shown on plate 114 are secondary by-pass circuits 120 and primary by-pass circuit 122. Thermoelectric elements 116 receive power on leads 124 and 126 that are coupled to electrically conductive strip 118. Each two rows of thermoelectric elements 116 has a secondary by-pass circuit 120 coupled in parallel across the rows as was previously described in connection with FIG. 2. The over-all thermoelectric device circuit 112 has primary by-pass circuit 122 coupled between the power leads 124 and 126. Thermally conductive plate 128 completes circuit 112 when it is placed on top of thermoelectric elements 116.

In operation of thermoelectric device circuit 112 of FIG. 4, circuit 112 receives DC current and voltage on leads 124 and 126. Electrically conductive strip 118 provides the DC current to thermoelectric elements 116. The operation of thermoelectric elements 116, secondary by-pass circuits 120, and primary by-pass circuit 122 is as described for circuit 18 of FIG. 2. The by-pass circuits provide fault tolerance in circuit 112 by providing a by-pass path whenever their associated thermoelectric element or elements fail. By-pass circuits 120 and 122 of circuit 112 can also be designed to provide a fault signal as described for FIG. 2. A fault signal from the by-pass circuits provides the technical advantages of fault isolation and notification in circuit 112.

Figure 5:
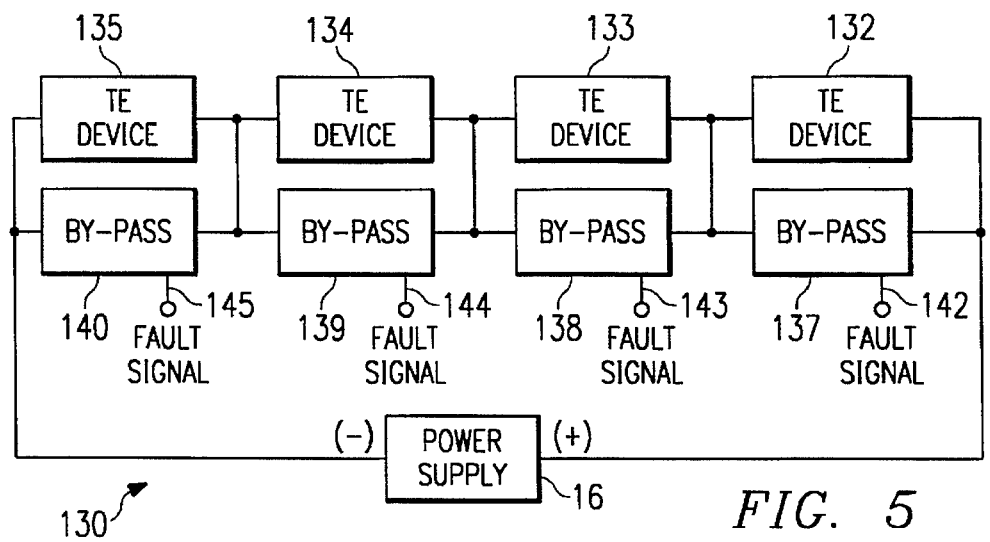
FIG. 5 is a circuit schematic depicting a fault tolerant thermoelectric system including a plurality of thermoelectric devices.

FIG. 5 is a circuit schematic depicting fault tolerant thermoelectric system 130, including multiple thermoelectric devices. System 130 includes four thermoelectric devices 132, 133, 134, and 135, in serial connection. The thermoelectric devices may be, for example, thermoelectric device 112 depicted in FIG. 4. Coupled in parallel with each thermoelectric device is a by-pass circuit. Therefore, thermoelectric device 132 has coupled in parallel with it by-pass circuit 137, thermoelectric device 133 has coupled in parallel to it by-pass circuit 138, thermoelectric device 134 has coupled in parallel to it by-pass circuit 139, and thermoelectric device 135 has coupled in parallel to it by-pass circuit 140. The by-pass circuits are, in turn, coupled in series.

Each by-pass circuit in FIG. 5, includes a fault signal terminal. Therefore, by-pass circuit 137 includes fault signal terminal 142, by-pass circuit 138 includes fault signal terminal 143, by-pass circuit 139 includes fault signal terminal 144, and by-pass circuit 140 includes fault signal terminal 145. Power supply 16 provides DC current and voltage to the thermoelectric devices and by-pass circuits within thermoelectric system 130.

The operation of system 130 of FIG. 5 relies on many of the concepts previously described in connection with thermoelectric device circuit 18 of FIG. 2. In operation of system 130 of FIG. 5, power supply 16 provides DC current and voltage to thermoelectric devices 132, 133, 134, and 135. Each of the bypass circuits is normally in an off-state and presents a high impedance path to the DC current supplied by power supply 16. Therefore, the current power supply 16 presents to by-pass circuit 137 does not normally enter by-pass circuit 137 due to the high impedance of circuit 137. The DC current is instead supplied to thermoelectric device 132 where the Peltier effect, as previously described, causes cooling or heating.

Since thermoelectric devices 132, 133, 134, and 135 are coupled in series, the current through the elements is generally constant. The operation of the other groups of thermoelectric devices and by-pass circuits of circuit 130 are as described for thermoelectric device 132 and by-pass circuit 137. Therefore, in normal operation, the thermoelectric devices use the current from power supply 16 for cooling and/or heating.

Should any of the thermoelectric devices of circuit 130 fail, then the failed device generally will cause an open circuit blocking current flow to the other devices. For example, if thermoelectric device 132 fails, it creates an open circuit. By-pass circuit 137, while a high impedance path, provides a lower impedance path than the open circuit of thermoelectric device 132. Current is, therefore, conducted through by-pass circuit 137 to the other devices of system 130. The failure of thermoelectric device 132 causes by-pass circuit 137 to turn on and provide a by-pass path around device 132 so that the DC current from power supply 16 goes to the remaining devices in system 130. In this manner, the failure of thermoelectric device 132 is detected and by-passed in by-pass circuit 137 so that the remaining thermoelectric devices in system 132 continue operating.

In a similar manner, should thermoelectric device 133 fail, then by-pass circuit 138 provides current to the remaining thermoelectric devices in system 130. Additionally, by-pass circuit 139 provides a by-pass path around thermoelectric device 134 should thermoelectric device 134 fail, and by-pass circuit 140 provides a by-pass path around thermoelectric device 135 should thermoelectric device 135 fail.

While the operation of the by-pass circuits of system 130 have been described in conjunction with a serial failure of thermoelectric devices 132, 133, 134, and 135, the operation of system 130 is not dependent on thermoelectric devices failing serially. One technical advantage of system 130 is that each by-pass circuit acts independently of other devices of system 130.

Providing the by-pass circuits with the capability to provide fault signals when providing the by-pass path, gives system 130 the technical advantages of fault notification and fault isolation. Coupling the fault signal terminal of each by-pass circuit to an indicating device, as is well known in the art, provides fault indication and fault isolation for system 130. In this manner, should thermoelectric device 134 fail causing the activation of by-pass circuit 139, by-pass circuit 139 generates a fault signal at fault signal terminal 144. Providing the fault signal to an appropriate indicator device, such as an LED or display, allows the failure of thermoelectric device 134 to be more efficiently detected and allows for easier troubleshooting of system 130. Providing fault signals from the by-pass circuits of system 130 gives the system the technical advantages of having fault isolation and fault notification.

While FIG. 5 shows four thermoelectric devices, each having a by-pass circuit associated with it, it is not intended that the present thermoelectric system be limited to this embodiment. A greater number of thermoelectric devices could be coupled to provide increased heating or cooling without departing from the inventive concepts of the present invention. Additionally, thermoelectric devices can be grouped with a single by-pass circuit providing a by-pass path around each group should any one of the thermoelectric devices in the group fail without departing from the inventive concepts of the present invention.

The operation of the thermoelectric device circuits including by-pass circuitry has been described in detail. In summary, when a serially coupled thermoelectric element or device fails, the associated by-pass circuit provides a by-pass path around the failed thermoelectric element or device so that the remainder of the circuit continues functioning. Including by-pass circuitry allows for providing fault isolation, fault tolerance, and fault notification for the thermoelectric device circuit.

Although the present invention has been described in detail, it should be understood that various changes, substitutions, and alterations can be made hereto without departing from the spirit and scope of the invention as defined by the appended claims.

What is claimed is:

1. A thermoelectric device comprising:
   at least one thermoelectric element;
   an electrical circuit for supplying electricity to said thermoelectric element;
   a by-pass circuit coupled in parallel with said thermoelectric element for providing an electrical path for electricity supplied to said thermoelectric element to by-pass said thermoelectric element in response to a failure of said thermoelectric element and to allow continued current flow through the electrical circuit;
   said by-pass circuit being operable to maintain substantially the same amount of current flow through the electrical circuit in response to said failure of said thermoelectric element; and
   said by-pass circuit having a normally off state which presents high impedance to said electrical circuit providing electricity to said thermoelectric element.

2. The thermoelectric device of claim 1 wherein said by-pass circuit further comprises:
   a sensor for sensing a failure of said thermoelectric element and for providing a control signal in response to said failure; and
   a switch for providing said by-pass circuit responsive to said control signal.

3. The thermoelectric device of claim 1 wherein said by-pass circuit further comprises:
   a voltage divider for providing a control signal in response to a failure of said thermoelectric element; and
   a switch for providing said by-pass circuit responsive to said control signal.

4. The thermoelectric device of claim 1 further comprising:
   a plurality of serially coupled thermoelectric elements; and
   a plurality of by-pass circuits each coupled in parallel with one of said thermoelectric elements, each by-pass circuit being operable to provide an electrical path for electricity supplied to its associated thermoelectric element to by-pass its associated thermoelectric element and to allow continued current flow through the electrical circuit, said by-pass circuits each being operable to maintain substantially the same amount of current flow through the electrical circuit in response to said failure of its associated thermoelectric element.

5. The thermoelectric device of claim 4 wherein the impedance of each by-pass circuit is nearly equivalent to the impedance of its associated thermoelectric element.

6. The thermoelectric device of claim 4 wherein the impedance of each by-pass circuit is less than the impedance of its associated thermoelectric element.

7. A thermoelectric device comprising:

a plurality of serially coupled thermoelectric elements;

an electrical circuit for supplying electricity to said thermoelectric device;

a plurality of by-pass circuits with each by-pass circuit coupled in parallel with a selected group of said thermoelectric elements, each of said plurality of by-pass circuits being operable to provide an electrical path for electricity supplied to its associated group of thermoelectric elements to by-pass said group of thermoelectric elements;

said by-pass circuits each being operable to maintain substantially the same amount of current flow through the electrical circuit in response to said failure of its associated thermoelectric element; and said by-pass circuits each having a normally off state which presents high impedance to said electrical circuit providing electricity to said thermoelectric device.

8. The thermoelectric device of claim 7 wherein the impedance of each by-pass circuit is nearly equivalent to the impedance of its associated group of thermoelectric elements.

9. The thermoelectric device of claim 7 wherein the impedance of each by-pass circuit is less than the impedance of its associated group of thermoelectric elements.

10. The thermoelectric device of claim 1 wherein said by-pass circuit provides a fault signal in response to said failure of said thermoelectric element.

11. The thermoelectric device of claim 1 further comprising:

a plurality of serially coupled thermoelectric elements;

a primary by-pass circuit coupled in parallel across all of said thermoelectric elements for providing an electrical path for electricity supplied to the thermoelectric device to by-pass all of said thermoelectric elements; and a plurality of secondary by-pass circuits each coupled in parallel with a selected group of said thermoelectric elements, each of said secondary by-pass circuits being operable to provide an electrical path for electricity supplied to its associated group of thermoelectric elements to by-pass said associated group of thermoelectric elements and to allow continued current flow through the other thermoelectric elements.

12. A thermoelectric system comprising:

a plurality of serially coupled thermoelectric devices for providing heat transfer when electricity is supplied to said thermoelectric devices and each of said thermoelectric devices comprising a plurality of thermoelectric elements for transferring said heat;

a plurality of by-pass circuits each coupled in parallel with one of said thermoelectric devices, each of said by-pass circuits being operable to provide an electrical path for electricity provided to its associated thermoelectric device to by-pass said thermoelectric device in response to a failure of said associated thermoelectric device and to allow continued current flow through the electrical circuit;

said by-pass circuits each being operable to maintain substantially the same amount of current flow through the electrical circuit in response to said failure of its associated thermoelectric element; and said by-pass circuits each having a normally off state which presents high impedance to said electrical circuit providing electricity to said thermoelectric device.

13. The thermoelectric system of claim 12 wherein each by-pass circuit provides a fault signal in response to failure of its associated thermoelectric device.

14. The thermoelectric system of claim 12 wherein the impedance of each by-pass circuit is nearly equivalent to the impedance of its associated thermoelectric device.

15. The thermoelectric system of claim 12 wherein the impedance of each by-pass circuit is less than the impedance of its associated thermoelectric device.

16. A method for providing fault tolerance for a thermoelectric device, comprising the steps of:

coupling a plurality of thermoelectric elements in an electrical circuit;

coupling in parallel to each thermoelectric element a by-pass circuit for providing an electrical path for electricity provided to the associated thermoelectric element to by-pass said thermoelectric element in response to a failure of said thermoelectric dement and to allow continued current flow through the electrical circuit;

maintaining substantially the same amount of current flow through the electrical circuit by said by-pass circuit in response to said failure of its associated thermoelectric element; and said by-pass circuits each having a normally off state which presents high impedance to said electrical circuit providing electricity to said thermoelectric device.

17. The method of claim 16 wherein said coupling step further comprises coupling in parallel to a selected group of thermoelectric elements an associated by-pass circuit for providing an electrical path for electricity provided to the selected group of thermoelectric devices to by-pass said group of thermoelectric elements in response to a failure by any one thermoelectric element in the selected group and to allow continued current flow through the electrical circuit.

18. The method of claim 16 further comprising the step of providing a fault signal with the by-pass circuit responsive to a failure of the associated thermoelectric element.

19. The method of claim 16 further comprising the step of serially coupling a plurality of the thermoelectric devices in an electrical circuit, each device coupled with a bypass circuit for providing an electrical path for electricity provided to the thermoelectric device to by-pass said thermoelectric device in response to a failure of the thermoelectric device and to allow continued current flow through the electrical circuit.

20. The method of claim 16 further comprising the steps of:

monitoring the performance of the thermoelectric elements with the by-pass circuit; and closing a switch in the by-pass circuit to complete the by-pass path in response to the failure of the associated thermoelectric element.

* * * * *